United States Patent
Iseki et al.

(10) Patent No.: US 8,999,604 B2
(45) Date of Patent: Apr. 7, 2015

(54) ORIENTED AMORPHOUS CARBON FILM AND PROCESS FOR FORMING THE SAME

(75) Inventors: Takashi Iseki, Aichi-gun (JP); Yuka Yamada, Toyota (JP); Kazuyuki Nakanishi, Seto (JP); Yasuhiro Ozawa, Aichi-gun (JP); Shingo Ohta, Nagoya (JP)

(73) Assignee: Kabushiki Kaisha Toyota Chuo Kenkyusho, Aichi-Gun (JP)

( * ) Notice: Subject to any disclaimer, the term of this patent is extended or adjusted under 35 U.S.C. 154(b) by 324 days.

(21) Appl. No.: 13/497,475

(22) PCT Filed: Dec. 24, 2010

(86) PCT No.: PCT/JP2010/007501
§ 371 (c)(1),
(2), (4) Date: Mar. 21, 2012

(87) PCT Pub. No.: WO2011/077746
PCT Pub. Date: Jun. 30, 2011

(65) Prior Publication Data
US 2012/0183887 A1 Jul. 19, 2012

(30) Foreign Application Priority Data
Dec. 25, 2009 (JP) ................................ 2009-293856

(51) Int. Cl.
*H01M 8/02* (2006.01)
*H01M 4/66* (2006.01)
(Continued)

(52) U.S. Cl.
CPC ............ *C01B 31/02* (2013.01); *H01M 8/0202* (2013.01); *B82Y 30/00* (2013.01); *B82Y 40/00* (2013.01);
(Continued)

(58) Field of Classification Search
USPC ..................... 428/408, 457, 689, 411.1, 446; 429/492, 34
See application file for complete search history.

(56) References Cited

U.S. PATENT DOCUMENTS

| 6,787,200 B1 | 9/2004 | Delaunay et al. |
| 7,368,168 B2 | 5/2008 | Mori et al. |

(Continued)

FOREIGN PATENT DOCUMENTS

| JP | A-10-25565 | 1/1998 |
| JP | A-2002-327271 | 11/2002 |

(Continued)

OTHER PUBLICATIONS

International Search Report mailed Feb. 8, 2011 issued in International Patent Application No. PCT/JP2010/007501 (with translation).

*Primary Examiner* — Sarah A Slifka
(74) *Attorney, Agent, or Firm* — Oliff PLC

(57) ABSTRACT

The oriented amorphous carbon film contains C as a main component, 3 to 20 at. % of N, and more than 0 at. % and not more than 20 at. % of H, and when the total amount of the C is taken as 100 at. %, the amount of C having an $sp^2$ hybrid orbital ($Csp^2$) being not less than 70 at. % and less than 100 at. %, and (002) planes of graphite being oriented along a thickness direction. This film has a novel structure and exhibits a high electric conductivity. This film can be formed by DC plasma CVD method in which an electric discharge is generated by applying a voltage of not less than 1500 V to reaction gas including at least one kind of compound gas selected from gas of a carbocyclic compound containing $Csp^2$ and gas of an N-containing heterocyclic compound containing $Csp^2$, and nitrogen and/or silicon, and nitrogen gas.

11 Claims, 4 Drawing Sheets

(51) Int. Cl.

| | |
|---|---|
| *C01B 31/02* | (2006.01) |
| *B82Y 30/00* | (2011.01) |
| *B82Y 40/00* | (2011.01) |
| *C01B 31/04* | (2006.01) |
| *H01M 4/96* | (2006.01) |
| *C23C 16/26* | (2006.01) |
| *C23C 16/503* | (2006.01) |
| *H01M 4/62* | (2006.01) |

(52) U.S. Cl.
CPC ............ *C01B 31/0438* (2013.01); *H01M 4/625* (2013.01); *H01M 4/663* (2013.01); *H01M 4/96* (2013.01); *Y02E 60/50* (2013.01); *C23C 16/26* (2013.01); *C23C 16/503* (2013.01)

(56) References Cited

U.S. PATENT DOCUMENTS

| | | | |
|---|---|---|---|
| 7,455,824 | B2 | 11/2008 | Nakanishi et al. |
| 7,833,626 | B2 | 11/2010 | Iseki et al. |
| 8,119,242 | B2 * | 2/2012 | Iseki et al. .................... 428/408 |
| 2005/0142361 | A1 | 6/2005 | Nakanishi et al. |
| 2005/0238877 | A1 | 10/2005 | Mori et al. |
| 2007/0074664 | A1 | 4/2007 | Nishimura et al. |
| 2008/0188383 | A1 | 8/2008 | Iseki et al. |
| 2009/0169968 | A1 | 7/2009 | Iseki et al. |

FOREIGN PATENT DOCUMENTS

| | | |
|---|---|---|
| JP | A-2003-504512 | 2/2003 |
| JP | A-2003-95627 | 4/2003 |
| JP | A-2004-284915 | 10/2004 |
| JP | A-2007-119908 | 5/2007 |
| JP | A-2008-4540 | 1/2008 |
| JP | A-2008-522020 | 6/2008 |
| WO | WO 01/03158 A1 | 1/2001 |
| WO | WO 2006/057436 A1 | 6/2006 |

* cited by examiner

ORIENTED AMORPHOUS CARBON FILM AND PROCESS FOR FORMING THE SAME

TECHNICAL FIELD

The present invention relates to an amorphous carbon film containing carbon as a main component and exhibiting electric conductivity, a process for forming the same, and an electrically conductive member having the amorphous carbon film.

BACKGROUND ART

Owing to its almost unlimited resources and harmlessness, carbon is an excellent material in view of resources and environmental problems. Carbon materials have diverse forms of interatomic bonding, and a variety of crystal structures are known, such as diamond, diamond-like carbon, graphite, fullerene and carbon nanotubes. Above all, diamond-like carbon having an amorphous structure (amorphous carbon) is expected to be applied in each industrial field, because of its high mechanical strength and good chemical stability. However, general amorphous carbon films have an electric resistance in a range of semiconductors to insulators. In order to further widen the use of amorphous carbon, it has been requested to impart electric conductivity to amorphous carbon.

Examples of a process for imparting electric conductivity to amorphous carbon include a process for adding a metal to amorphous carbon. For example, PTL 1 discloses a carbon film containing metal elements and including clusters having a graphite structure in an amorphous structure. The clusters are formed in areas surrounding the added metal. However, the added metal may become a cause of corrosion or, when used in contact with another metal, may become a cause of adhesion, so inherent chemical stability of amorphous carbon can be damaged.

On the other hand, in PTL 2, electric conductivity is imparted to amorphous carbon without adding metal. PTL 2 discloses a carbon film having a structure in which $sp^2$-bonded crystals having $sp^2$-bonded carbon within part of the crystal extend continuously from a lowermost layer (a substrate side) to an uppermost layer (a surface side) of the film in a film thickness direction and other portions than the $sp^2$-bonded crystals are amorphous. According to the description of PTL 2, a reduction in the content of $sp^2$-bonded crystals is important in view of corrosion resistance and wear resistance of the carbon film. Therefore, it is desirable that the $sp^2$-bonded crystals extend continuously from the substrate side to the surface side of the carbon film, because it is effective in increasing electric conductivity in a film thickness direction of the carbon film and as a result can reduce the content of the $sp^2$-bonded crystals. Moreover, PTL 2 also states that an increase in the content of the $sp^2$-bonded crystals causes a decrease in hardness and wear resistance of the carbon film. That is to say, PTL 2 suggests that the amorphous portions of the carbon film contain a large amount of $sp^a$-bonded carbon, which improves wear resistance and hardness.

Moreover, the present inventors found that electric conductivity can be imparted to an amorphous carbon film by increasing the amount of carbon having an $sp^2$ hybrid orbital and invented amorphous carbon recited in PTL 3. Depending on a difference in atomic orbital in chemical bonding, there are three types of carbon atoms: carbon having an sp hybrid orbital (Csp), the abovementioned carbon having an $sp^2$ hybrid orbital ($Csp^2$), and carbon having an $sp^a$ hybrid orbital ($Csp^3$). For example, diamond, which is composed of $Csp^3$ only, forms σ bonds only and exhibits high electric insulation due to localization of a electrons. On the other hand, graphite is composed of $Csp^2$ only and forms a bonds and π bonds and exhibits high electric conductivity due to delocalization of π electrons. In the amorphous carbon film recited in PTL 3, delocalization of π electrons is promoted due to a large content of $Csp^2$ in the entire carbon and molecular termination by C—H bonds (a bonds) is suppressed due to a decrease in hydrogen content. As a result, the carbon film of PTL 3 exhibits a high electric conductivity.

CITATION LIST

Patent Literature

[PTL 1] Japanese Unexamined Patent Publication No. 2004-284915
[PTL 2] Japanese Unexamined Patent Publication No. 2002-327271
[PTL 3] Japanese Unexamined Patent Publication No. 2008-4540

SUMMARY OF INVENTION

Technical Problems

Amorphous carbon films are predicted to be used in a wider variety of fields than ever upon a further improvement in electric conductivity. Carbon films disclosed by PTL 1 and PTL 2 have a structure in which electrically conductive microcrystals are dispersed in amorphous carbon. However, in such a structure in which amorphous phase and crystal phase are mixedly present, there is a limit in improvement of electric conductivity.

It is an object of the present invention to provide an oriented amorphous carbon film having a novel structure and exhibiting a high electric conductivity, and a process for forming the same.

Solution to Problems

As a result of their earnest studies, the present inventors have found that in the amorphous carbon film recited in PLT 3, an amorphous carbon film having a very high electric conductivity mainly in a thickness direction and fineness can be obtained by orienting (002) planes of graphite in a thickness direction within the film while keeping an amorphous structure. The present inventors have done further research based on this finding and completed a variety of inventions as follows.

That is to say, an oriented amorphous carbon film of the present invention contains carbon (C) as a main component, 3 to 20 atomic % of nitrogen (N), and more than 0 atomic % and not more than 20 atomic % of hydrogen (H), and when the total amount of the carbon is taken as 100 atomic %, the amount of carbon having an $sp^2$ hybrid orbital being not less than 70 atomic % and less than 100 atomic %, and (002) planes of graphite being oriented along a thickness direction thereof.

In the oriented amorphous carbon film of the present invention, not less than 70 atomic % of the amount of C contained is carbon having an $sp^2$ hybrid orbital ($Csp^2$). Further, (002) planes of graphite are oriented along a thickness direction. That is to say, owing to a structure in which each ring structure continuously extends in a thickness direction and such ring structures are layered, the oriented amorphous carbon film exhibits a high electric conductivity in the thickness direction. Besides, because of containing N and H, even though oriented, the oriented amorphous carbon film of the present invention does not have a full crystal structure (graphite structure) but have an amorphous structure having no long-distance order.

Moreover, owing to its fineness, the highly oriented amorphous carbon film is a film having a high film density and a high hardness. Therefore, the oriented amorphous carbon film of the present invention is highly reliable in terms of corrosion resistance, chemical resistance, oxygen barrier property and so on, not to mention high mechanical properties.

A method for forming an oriented amorphous carbon film according to the present invention is a method for forming the abovementioned oriented amorphous carbon film of the present invention on a surface of a substrate by direct current plasma CVD method, comprising:

placing the substrate in a reaction vessel, introducing reaction gas comprising at least one kind of compound gas selected from the group consisting of gas of a carbocyclic compound containing carbon having an $sp^2$ hybrid orbital and gas of an N-containing heterocyclic compound containing carbon having an $sp^2$ hybrid orbital, and nitrogen and/or silicon, and nitrogen gas into the reaction vessel, and generating an electric discharge by applying a voltage of not less than 1500 V.

The abovementioned oriented amorphous carbon film can be easily formed by DC plasma CVD method using a particular combination of reaction gases and applying a high voltage. The reason is assumed as follows.

In general, when electrons collide against a hydrocarbon, a C—H bond is broken and the hydrocarbon is ionized. When gas of a hydrocarbon comprising $Csp^3$ such as methane is used, even if a C—H bond is broken, the hydrocarbon is easily taken into the film while keeping four-coordinated stereo structure. Therefore, it is believed that strong orientation is difficult to occur and an amorphous carbon film having a particular orientation cannot be formed. On the other hand, when a high voltage of not less than 1500 V is applied to gas of a compound having a ring structure such as benzene and pyridine, it is believed that when the compound is ionized, a strong polarizing action occurs within a plane, so positive charge and negative charge are generated in the plane. It is assumed that strongly polarized ions are attracted to a cathode side (a substrate side) by the high negative voltage and deposited while keeping its ring structure. FIG. 1 is a schematic view illustrating a mechanism for forming an oriented amorphous carbon film when pyridine gas is employed as the compound gas. Among compound gases, especially pyridine greatly polarizes upon application of a high voltage, because N carries a negative charge and remnant C carries a positive charge from the beginning. Therefore, it is assumed that if gas of a chemical compound containing N in a ring structure is employed as the compound gas, an amorphous carbon film is more easily oriented. Moreover, upon using nitrogen gas together with the above compound gas, H in a C—H bond of the compound gas is replaced with N. It is assumed that as a result of that, the hydrogen content of the oriented amorphous carbon decreases and polarization of the compound gas is promoted.

It should be noted that, when a film is formed on a surface of a substrate, a "thickness direction" as used herein is a direction perpendicular to the surface of the substrate. It can also be said as a deposited direction of carbon and so on during film formation. Moreover, "oriented along a thickness direction" includes not only a case in which (002) planes of graphite of an oriented amorphous carbon film are parallel to a thickness direction of the film but also a case in which the (002) planes are slightly inclined with respect to the thickness direction.

Moreover, the oriented amorphous carbon film of the present invention is suitable as an electrically conductive member owing to its good electric conductivity. That is to say, an electrically conductive member of the present invention comprises a substrate and the abovementioned oriented amorphous carbon film of the present invention formed on at least part of the substrate. The electrically conductive member of the present invention has the abovementioned oriented amorphous carbon film of the present invention. Owing to its high orientation, the oriented amorphous carbon film exhibits high electric conductivity and is a fine film having a high density. Moreover, the oriented amorphous carbon film has the inherent wear resistance, solid lubricating properties, corrosion resistance and so on of amorphous carbon. Therefore, the electrically conductive member of the present invention is suitable for members such as a member which conducts electricity upon brought in contact, and a member such as bipolar plates for a fuel cell, which are used in a severe corrosive environment and demanded to have high electric conductivity.

Advantageous Effects of Invention

Owing to its high orientation, the oriented amorphous carbon film of the present invention exhibits a high electric conductivity and is a fine film having a high density. Besides, the forming process of the present invention can easily form the oriented amorphous carbon film of the present invention.

DESCRIPTION OF EMBODIMENTS

Hereinafter, best modes for carrying out the oriented amorphous carbon film and the process for forming the same according to the present invention will be described. It should be noted that a numerical range "x to y" as recited herein includes both a lower limit x and an upper limit y, unless

Oriented Amorphous Carbon Film

The oriented amorphous carbon film of the present invention contains carbon (C) as a main component, and 3 to 20 at. % of nitrogen (N), and more than 0 at. % and not more than 20 at. % of hydrogen (H), and when the total amount of the carbon is taken as 100 at. %, the amount of carbon having an sp$^2$ hybrid orbital (the amount of Csp$^2$) is not less than 70 at. % and less than 100 at. %.

Figure 1:
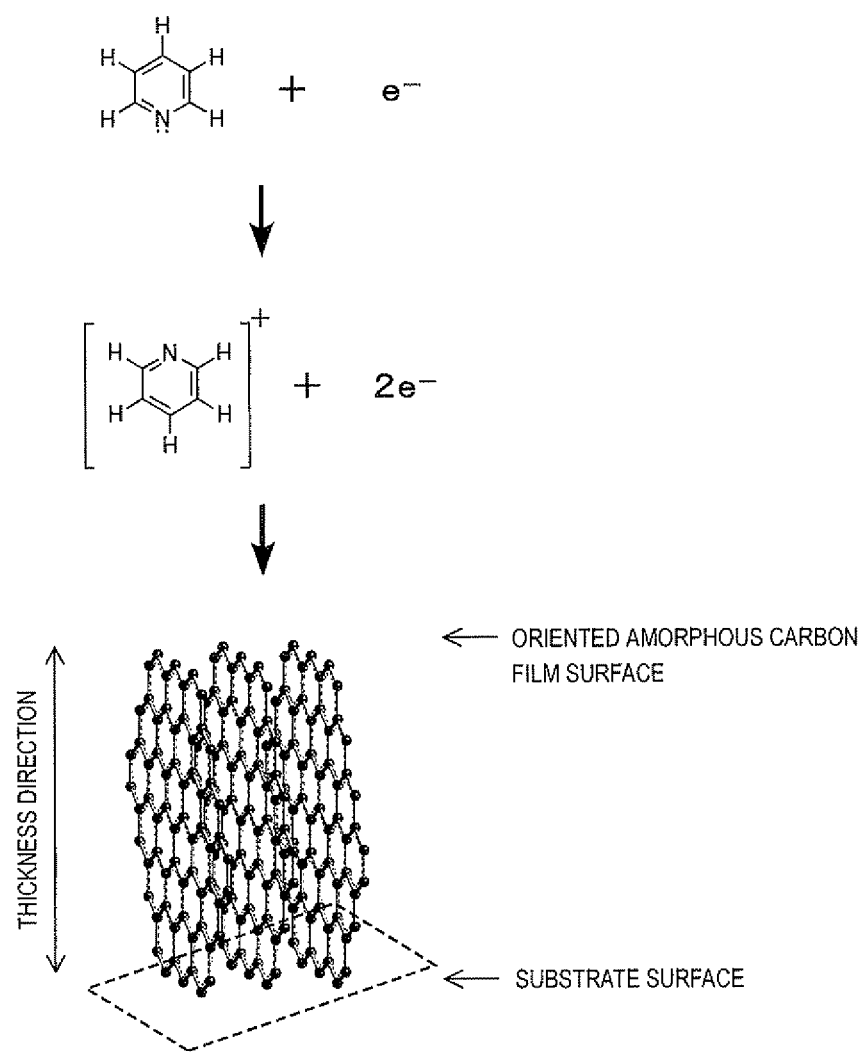
FIG. 1 is a schematic diagram illustrating a mechanism for forming an oriented amorphous carbon film of the present invention.
Figure 2:
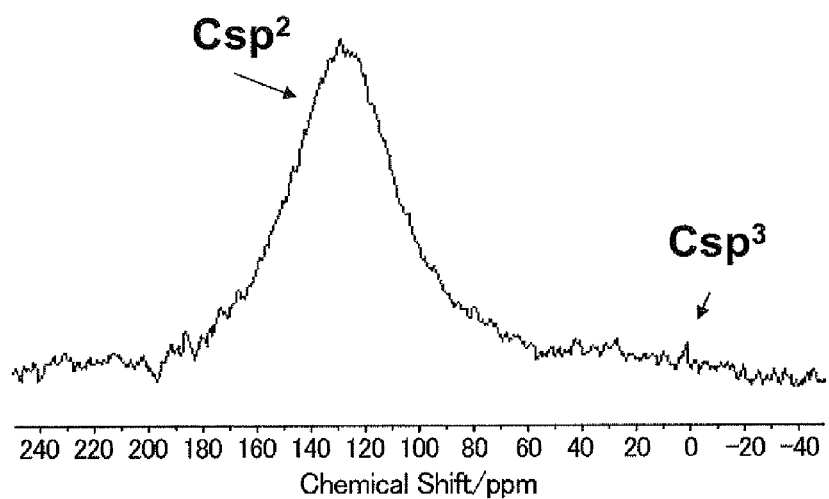
FIG. 2 is an example of a $^{13}C$ NMR spectrum of an amorphous carbon film.

Employed herein as a method for determining the amount of Csp$^2$ or Csp$^3$ is a nuclear magnetic resonance (NMR) method, which exhibits the highest abilities to measure quantitative characteristics in determining the structure of a lot of organic and inorganic materials. The amount of Csp$^2$ or Csp$^3$ was measured using high-power decoupling with magic angle spinning (HD-MAS), which has a quantitative-characteristic measurability in solid-state NMR. FIG. 2 shows an example of a $^{13}$C NMR spectrum of an amorphous carbon film. As shown in FIG. 2, peaks attributed to Csp$^2$ and Csp$^3$ are observed around 130 ppm and 30 ppm, respectively. Ratio of the amount of Csp$^2$ and the amount of Csp$^3$ contained in the total amount of carbon was calculated from a ratio in areas of portions surrounded by the respective peaks and a baseline.

The amount of Csp$^2$ of the oriented amorphous carbon film thus calculated is not less than 70 at. % and less than 100 at. % when the total amount of carbon is taken as 100 at. %. When the amount of Csp$^2$ is not less than 70 at. %, delocalization of π electrons is promoted and high electric conductivity is exhibited. However, when the amount of Csp$^2$ is 100 at. %, electric conductivity is obtained but amorphous carbon becomes powdery and it is difficult to obtain an oriented amorphous carbon film. It is preferable that the amount of Csp$^2$ of the oriented amorphous carbon film is not less than 80 at. %, not less than 90 at. %, not less than 92 at. % or not less than 94 at. %, while not more than 99.5 at. % or not more than 99 at. %. It should be noted that carbon constituting the oriented amorphous carbon film is believed to be two kinds: Csp$^2$ and Csp$^3$. Therefore, the amount of Csp$^3$ of the oriented amorphous carbon film is not more than 30 at. % (excluding 0 at. %), when the total amount of carbon is taken as 100 at. %.

The oriented amorphous carbon film contains 3 to 20 at. % of nitrogen (N). In the amorphous carbon film containing not less than 3 at. % of nitrogen and formed by the film-forming process mentioned later, (002) planes of graphite are oriented in a thickness direction thereof. Moreover, since nitrogen atoms serve as n-type donors in the oriented amorphous carbon film and effectively excite electrons trapped in the donor level to the conduction band, electric conductivity of the oriented amorphous carbon film is further increased. Preferably the N content is not less than 5 at. % or not less than 7 at. %. However, since a large N content promotes molecular termination due to formation of bonds, the N content is suppressed to not more than 20 at. %. Preferably the N content of the oriented amorphous carbon film is not less than 11 at. % or not less than 11.5 at. % while not more than 17 at. %, not more than 15 at. % or not more than 13.5 at. %.

The hydrogen (H) content of the oriented amorphous carbon film is more than 0 at. % and not more than 20 at. %. Since molecular termination by C—H bonds (σ bonds) is suppressed by reducing the H content, π electrons increase and a high electric conductivity is exhibited. Therefore, as the oriented amorphous carbon film has a smaller H content, effect of improving electric conductivity is greater. Accordingly, it is preferable that the H content is not more than 19 at. % or not more than 18 at. %. Moreover, electric conductivity increases with a decrease in the H content, but if the H content has to be defined, the H content can be not less than 5 at. %, not less than 8 at. %, not less than 10 at. %, or not less than 12 at. %.

The oriented amorphous carbon film can further contain silicon. Not more than 1 at. % of silicon (Si) in the oriented amorphous carbon film has little effect on orientation or electric conductivity of the oriented amorphous carbon film, increases density of the oriented amorphous carbon film and improves adhesion between the oriented amorphous carbon film and the substrate. Preferably the Si content of the oriented amorphous carbon film is not less than 0.5 at. % or not less than 0.75 at. %, while less than 1 at. %.

As mentioned above, the oriented amorphous carbon film of the present invention comprises hydrogen, nitrogen, and if necessary, silicon, with the remainder being carbon and inevitable impurities, and it is desirable that the oriented amorphous carbon film substantially does not contain other elements. However, when the entire amorphous carbon film is taken as 100 at. %, the amorphous carbon film can further contain not more than 3 at. % of oxygen (O). If the oxygen content, which results from oxygen gas mixed during formation of the oriented amorphous carbon film, is controlled to not more than 3 at. %, formation of oxides such as silicon oxide can be suppressed, so oxygen inclusion is permitted. Preferably the O content is not more than 2 at. % or not more than 1 at. %.

Moreover, in the oriented amorphous carbon film, (002) planes of graphite are oriented along a thickness direction thereof. It can be confirmed by X-ray diffraction measurement mentioned below that (002) planes of graphite are oriented along a thickness direction of the oriented amorphous carbon film.

Figure 3:
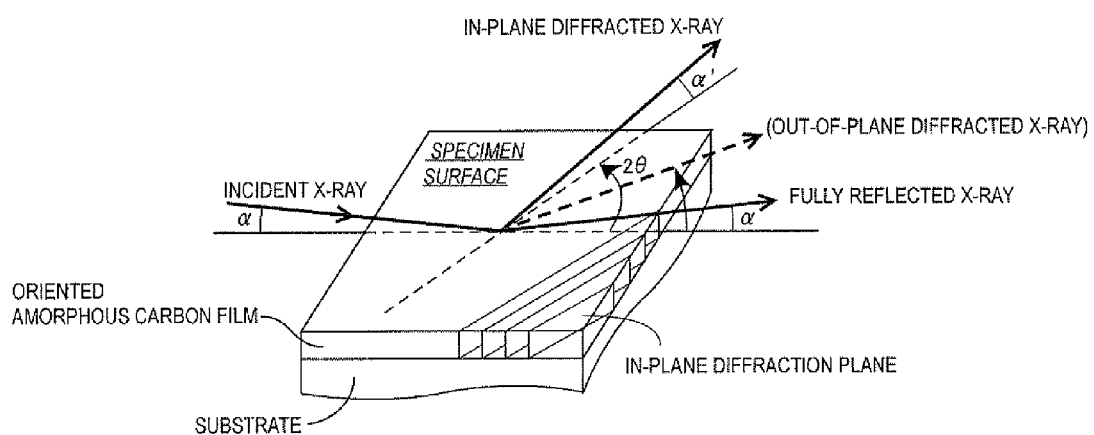
FIG. 3 is a schematic diagram illustrating a method for measuring in-plane X-ray diffraction (scattering) in order to confirm orientation of an oriented amorphous carbon film of the present invention.

Depending on geometrical arrangement of the direction of lattice planes to be measured, X-ray diffraction method is roughly classified into two kinds: out-of-plane diffraction measurement and in-plane diffraction measurement. The out-of-plane diffraction measurement method is a scanning with an incident X-ray beam angle fixed, and crystal planes to be observed are parallel to a specimen surface. On the other hand, the in-plane diffraction measurement method is performed by precisely controlling an incident X-ray beam angle to be nearly in parallel to a specimen surface. With reference to FIG. 3, an incident angle α is typically 0.5 deg. or less and when the incident X-ray beam has an energy of 12 key, the incident angle α is 0.1 deg. or less. A detector for an in-plane diffracted X-ray beam measures the intensity of a diffracted X-ray beam not in such a manner to rise up with respect to a specimen surface like in a σ-2σ method for measuring an out-of-plane diffracted X-ray beam but in such a manner to slide on a specimen surface while forming a slight angle therewith. That is to say, a visual angle α' of a beam radiating portion viewed from a specimen surface is kept constant. Crystal planes contributing to in-plane diffraction (diffraction planes) are planes perpendicular to the specimen surface.

When (002) planes of graphite are oriented along a thickness direction of a film, a peak corresponding to (002) planes is remarkably shown in an in-plane diffraction spectrum. For example, a peak around 2θ=17 deg. is shown stronger than a peak around 2θ=29 deg. (see FIG. 7B). The peak around 2θ=17 deg. corresponds to (002) planes of graphite and the peak around 2θ=29 deg. corresponds to (100) planes of graphite. Orientation can be expressed more specifically in terms of numerical values by using an orientation index. In the description of the present invention, an orientation index D, and orientation indexes r, r' described below are employed as orientation indexes.

$$D=(I_{002}/I_{100})/(I_{002}'/I_{100}')$$

where $I_{002}$, $I_{100}$, $I_{002}'$, and $I_{100}'$ are respectively intensity of peaks obtained by measuring X-ray diffraction of an amorphous carbon film. $I_{002}$ is intensity of an in-plane diffraction peak from (002) planes, $I_{100}$ is intensity of an in-plane diffraction peak from (100) planes, $I_{002}'$ is intensity of an out-of-plane diffraction peak from (002) planes, and $I_{100}'$ is intensity of an out-of-plane diffraction peak from (100) planes. Each of them is a maximum intensity around an angle (2θ) at which a diffraction peak from (002) planes or (100) planes is observed. Preferably the orientation index D of an oriented amorphous carbon film is not less than 9, not less than 10, not less than 20, not less than 30, not less than 50, or not less than 500. Although not particularly defined, an upper limit value of the orientation index D is preferably not more than 1000 or not more than 800.

If the orientation index is to be defined more precisely, powder X-ray diffraction simulation of 2H graphite (hexagonal graphite) may be performed on structural parameters from (002) plane orientation through random orientation to (100) plane orientation, to obtain a relation between a diffraction pattern (i.e., intensity of peaks) and the structural parameters, and an orientation index r corresponding to the above "$I_{002}/I_{100}$" and an orientation index r' corresponding to the above "$I_{002}'/I_{100}'$" can be calculated from the relation between the diffraction pattern and the structure parameters. The powder X-ray diffraction simulation can be performed by using a common Rietveld refinement software. In this case, of various structural parameters, a structural parameter corresponding to an orientation index is a preferred orientation parameter, which is 1 at random orientation. Method for calculating an orientation index will be described in detail in the section of examples, but it is preferable that the orientation index r of in-plane diffraction of the oriented amorphous carbon film is 0.9 to 1.6 or 1 to 1.5, and the orientation index r' of out-of-plane diffraction of the oriented amorphous carbon film is not less than 2, not less than 3.5, or not less than 4.5. Although not particularly defined, an upper limited value of the orientation index r' is preferably not more than 10 or not more than 7.

For the above peak intensity, it is necessary to obtain a value by subtracting background from an X-ray diffraction spectrum. The subtraction of the background can be performed by using a commercially available software or the method described in detail in the section of the examples.

It should be noted that the oriented amorphous carbon film of the present invention is an amorphous carbon film containing carbon as a main component. This is because degree of crystallinity is decreased by containing predetermined amounts of nitrogen and hydrogen in addition to carbon. The fact that the oriented amorphous carbon film is amorphous can be confirmed by pulverizing the oriented amorphous carbon film into powder and performing X-ray diffraction measurement on the powder. According to X-ray diffraction measurement, sharp diffraction peaks indicating presence of crystal are not detected and a diffraction peak corresponding to (002) planes of graphite shows a broad halo pattern.

In this case, it is preferable that mean interplanar spacing between (002) planes calculated from Bragg's Law is 0.34 to 0.50 nm. When the mean interplanar spacing between (002) planes is not more than 0.50 nm, owing to the small interplanar spacing, π electron interaction between the planes is increased and electric conductivity is improved. It should be noted that mean interplanar spacing between (002) planes of graphite is 0.34 nm.

It should be noted that "having electric conductivity" as used herein means to exhibit a volume resistivity of not more than $10^2$ ohm cm. Electric conductivity of the amorphous carbon film of the present invention is not particularly limited, but it is preferable that volume resistivity is not more than $10^2$ ohm cm, not more than $10^1$ ohm cm, not more than $5\times10^{-1}$ ohm cm, not more than $10^{-1}$ ohm cm, or not more than $10^{-2}$ ohm cm. It should also be noted that the volume resistivity of the oriented amorphous carbon film as used herein is defined as a value obtained by measuring volume resistivity of a film surface by four probe method. In the oriented amorphous carbon film, (002) planes of graphite are oriented along a thickness direction. Therefore, it is estimated that electric resistance measured by applying an electric current in a thickness direction of the oriented amorphous carbon film is even lower. For example, highly oriented pyrolytic graphite (HOPG) has a volume resistivity of about $10^{-1}$ ohm cm in an interlayer direction and about $10^{-3}$ ohm cm in a layer-extending direction.

Process for Forming an Oriented Amorphous Carbon Film

The oriented amorphous carbon film of the present invention mentioned above can be formed by DC plasma CVD method. Employment of direct current system enables formation of a highly oriented amorphous carbon film. Besides, the DC plasma CVD method has an advantage of obtaining a stable electric discharge even at a high reaction gas concentration and a high film-forming pressure of not less than 100 Pa.

When the amorphous carbon film of the present invention is formed by DC plasma CVD method, first a substrate is placed in a vacuum vessel and a reaction gas (and a carrier gas, if necessary) is introduced. Next, plasma is generated by an electric discharge and plasma carbon and so on can be deposited on the substrate. However, in order to form an amorphous carbon film having a high ratio of $Csp^2$ in the entire carbon and having a particular orientation like the abovementioned oriented amorphous carbon film, it is necessary to select and use a particular kind of reaction gas, which will be mentioned in detail later.

The process for forming the oriented amorphous carbon film according to the present invention comprises placing a substrate in a reaction vessel, introducing a particular reaction gas into the reaction vessel, and generating an electric discharge by applying a high voltage. It should be noted that this process can also be grasped as a process for producing a conductive member mentioned later.

As the substrate, it is possible to use a material selected from metal, semiconductor, ceramic, resin and so on. Examples of the substrate include a metallic substrate such as iron or iron-based alloys such as stainless steel, carbon steel, alloy steel and cast iron, aluminum or aluminum alloys, titanium or titanium alloys, and copper or copper alloys; a semimetallic substrate such as silicon; a ceramic substrate such as cemented carbide, silica, alumina and silicon carbide; and a resin substrate such as polyimide, polyamide and polyethylene terephthalate. It should be noted that in the DC plasma CVD method, a substrate in itself serves as an electrode (a negative electrode). Therefore, the substrate needs to comprise an electrically conductive material. However, an oriented amorphous carbon film can be formed even on a substrate comprising one of the abovementioned electrically insulating materials upon imparting electric conductivity to at least a surface on which an oriented amorphous carbon film is to be formed, for example, by forming a coating film comprising an electrically conductive material.

Moreover, from the viewpoint of improving adhesion between the substrate and the oriented amorphous carbon film, it is preferable to apply treatment for forming concavities and convexities by ion bombardment to a surface of the substrate in advance. Specifically, first, a substrate is placed in a reaction vessel, and gases in the reaction vessel are evacuated to a predetermined gas pressure. Next, a noble gas for forming concavities and convexities is introduced into the reaction vessel. Then, ion bombardment is carried out by glow discharge or ion beam, thereby forming concavities and convexities on the surface of the substrate. Moreover, in order to form uniform and fine concavities and convexities on the surface of the substrate, nitriding treatment can be applied before the treatment for forming concavities and convexities. Examples of the method for nitriding treatment include gas nitriding, salt bath nitriding and ion nitriding.

Employed as the reaction gas is a reaction gas containing the compound gas described in detail below and nitrogen gas. As the nitrogen gas, it is possible to employ commercially available high purity nitrogen gas, high quality nitrogen gas and so on (for example, purity: 99% or more).

Employed as the compound gas is at least one kind of compound gas selected from the group consisting of gas of a carbocyclic compound containing carbon having an $sp^2$ hybrid orbital, and gas of an N-containing heterocyclic compound containing carbon having an $sp^2$ hybrid orbital, and nitrogen and/or silicon. It should be noted that a "carbocyclic compound" is a cyclic compound in which all atoms constituting a ring are carbon atoms. In contrast, a "heterocyclic compound" is a cyclic compound in which a ring is constituted by two or more kinds of atoms. Examples of the carbocyclic compound containing $Csp^2$, in other words, the carbocyclic compound having a carbon-carbon double bond include not only aromatic hydrocarbons such as benzene, toluene, xylene, and naphthalene, but also cyclohexene. It is also possible to use a carbocyclic compound containing nitrogen together with $Csp^2$, and examples of such a compound include N-containing aromatic compounds such as aniline and azobenzene. Examples of the heterocyclic compound include N-containing heterocyclic compounds such as pyridine, pyrazine, pyrrole, imidazole and pyrazole, in which a ring is constituted by carbon and nitrogen. Depending on composition of the oriented amorphous carbon film, it is possible to use a single kind of gas or a gas mixture of two or more kinds of gases of the carbocyclic compound gases and the heterocyclic compound gases. Pyridine is especially preferred as the compound gas in view of orientation.

When a silicon-containing oriented amorphous carbon film is to be formed, it is also possible to employ, as the compound gas, gas of a carbocyclic compound containing $Csp^2$ and Si, such as phenylsilane and phenylmethylsilane, and/or gas of a silicon-containing heterocyclic compound containing $Csp^2$ and Si. Moreover, the reaction gas can further contain a saturated organic silicon compound gas. Examples of the gas include $Si(CH_3)_4$, $Si(CH_3)_3H$, $Si(CH_3)_2H_2$, $Si(CH_3)H_3$, $SiH_4$, $SiCl_4$, and $SiH_2F_4$. TMS is particularly preferred because it is chemically stable in the air and easy to handle.

Flow rate of the reaction gas is not particularly limited, as long as the abovementioned compound gas and nitrogen gas are employed together. However, an oriented amorphous carbon film having high orientation and a high nitrogen content can be easily obtained by controlling the nitrogen gas flow rate to not less than the compound gas flow rate.

Moreover, a carrier gas can be introduced together with the reaction gas. When a carrier gas is used, a film-forming atmosphere is constituted by the reaction gas and the carrier gas. Usable as the carrier gas is argon gas, helium gas or the like. It should be noted that in forming a conventional amorphous carbon film, hydrogen gas is sometimes employed as a carrier gas. However, in forming an oriented amorphous carbon film having a hydrogen content of not more than 20 at. %, film formation without using hydrogen gas is preferred. Preferably flow rate of the carrier gas is suppressed to not more than the reaction gas flow rate. If desired flow rate of the reaction gas and that of the carrier gas are to be specifically defined, it is preferable that the flow rate of the carrier gas is 0 to 1200 sccm (standard cc/min) and the flow rate of the reaction gas is 1 to 2500 sccm (the compound gas: 1 to 1500 sccm, nitrogen gas: 1 to 1600 sccm).

It is preferable that pressure of a film-forming atmosphere is not less than 0.1 Pa and not more than 1300 Pa, not less than 1 Pa and not more than 500 Pa, or not less than 3 Pa and not more than 100 Pa. As the film-forming pressure is higher, the concentration of the reaction gas is higher. Hence, film-forming rate is high and a thick film can be formed at a practically high rate.

Although not particularly limited, surface temperature of a substrate during formation of an amorphous carbon film (film-forming temperature) is desirably not less than 300 deg. C., not less than 325 deg. C., or not less than 340 deg. C. As the film-forming temperature is higher, the amount of hydrogen contained in the oriented amorphous carbon film is reduced and electric conductivity is improved. Especially by controlling the film-forming temperature to not less than 500 deg. C. or not less than 550 deg. C., a highly electrically conductive amorphous carbon film having a low volume resistivity and a low contact resistance can be obtained. However, an excessively high film-forming temperature is not desired because a substrate may deteriorate or a dense film cannot be obtained due to deterioration of orientation of an oriented amorphous carbon film. Besides, depending on the kind of substrate, a reaction product of a component of the substrate and carbon is sometimes generated at an interface between the substrate and the amorphous carbon film. For example, when a titanium substrate is employed, TiC is generated at an interface. Since TiC is susceptible to corrosion, corrosion resistance of an electrically conductive member to be obtained sometimes decreases. Therefore, it is desirable that the film-forming temperature is not more than 700 deg. C. or not more than 650 deg. C. It should be noted that the film-forming temperature is obtained by measuring temperature of a surface of a substrate during film formation by using a thermocouple, an infrared radiation thermometer, or the like.

Moreover, upon controlling voltage for an electric discharge (discharge voltage) to not less than 1500 V, a highly oriented amorphous carbon film can be formed. With a discharge voltage of not less than 1500 V, an oriented amorphous carbon film can be easily formed at a standard film-forming temperature (300 to 700 deg. C) of DC plasma CVD method. Preferred discharge voltage is not less than 1750 V, and more preferred discharge voltage is not less than 1900 V. As the discharge voltage is higher, orientation is higher and a dense film is efficiently formed, but a discharge voltage of not more than 5000 V is practically used. However, even if the discharge voltage is less than 2000 V, less than 1900 V, less than 1750 V, or less than 1500 V, a highly oriented amorphous carbon film can be formed by increasing film-forming temperature, for example, by heating a substrate.

Electrically Conductive Member Having an Oriented Amorphous Carbon Film

The oriented amorphous carbon film of the present invention is suitable for various kinds of electrically conductive members. A conductive member comprises a substrate, and the abovementioned oriented amorphous carbon film of the present invention formed on at least part of the substrate.

As for the substrate, a description has already been given in the section of <Process for Forming an Oriented Amorphous Carbon Film>. Upon forming the oriented amorphous carbon film on a substrate having a low electric conductivity, high electric conductivity can be imparted to a portion where the oriented amorphous carbon film is formed, or upon forming the oriented amorphous carbon film on a surface of an electrically conductive substrate, corrosion resistance, wear resistance, solid lubricating properties and the like can be imparted to the substrate without lowering electric conductivity of the substrate. For example, taking advantage of electric conductivity and corrosion resistance of the oriented amorphous carbon film, the conductive member can be used as materials for various kinds of electrodes such as an electrode for plating and a battery electrode and a plug electrode. Moreover, taking advantage of electric conductivity and sliding properties of the oriented amorphous carbon film, the conductive member can be used for contact point members such as a switch contact point, a key contact point and a sliding contact point. Owing to its good electric conductivity and denseness, an electrically conductive member having an especially highly oriented amorphous carbon film can be used as a bipolar plate for a fuel cell, which is demanded to have high corrosion resistance and electric conductivity.

It should be noted that denseness of the oriented amorphous carbon film as used herein is evaluated by measuring density of the film. Measurement of density can be conducted by commonly used measurement methods, and specific procedure will be described in detail in the section of the examples. The oriented amorphous carbon film of the present invention has a density of not less than $1.6 \text{ g/cm}^3$, not less than $1.8 \text{ g/cm}^3$ or not less than $2.0 \text{ g/cm}^3$. If an upper limit of film density is to be defined, not more than $3 \text{ g/cm}^3$ or not more than $2.4 \text{ g/cm}^3$ is preferred.

Film thickness of the oriented amorphous carbon film in the electrically conductive member is not particularly limited and can be arbitrarily selected in accordance with application purposes. If the film thickness has to be defined, it is preferable that the film thickness is not less than 1 nm or not less than 10 nm. However, since the oriented amorphous carbon film of the present invention is dense, possibility of peeling or cracking is higher with an increase in film thickness. Therefore, it is preferable that the film thickness is not more than 20 µm or not more than 10 µl.

Hereinbefore, the modes for carrying out the oriented amorphous carbon film and the process for forming the same according to the present invention have been described, but the present invention is not limited to the above modes. The present invention can be carried out in a variety of forms, modified and improved by those skilled in the art within a range not departing the gist of the present invention.

EXAMPLES

Hereinafter, the present invention will be specifically described by way of examples of the oriented amorphous carbon film and the process for forming the same according to the present invention. First, a DC plasma CVD film-forming device (abbreviated as a "PCVD film-forming device") used for producing an electrically conductive member and procedure for forming the oriented amorphous carbon film will be described with reference to FIG. 4.

PCVD Film-Forming Device

Figure 4:
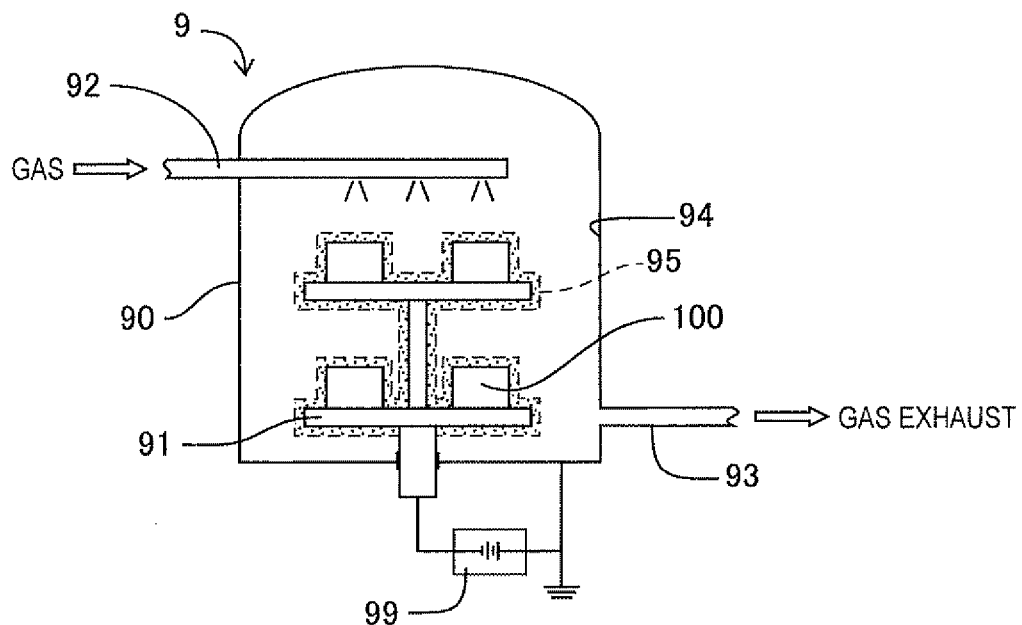
FIG. 4 is a schematic diagram of a DC plasma CVD film-forming device.

As shown in FIG. 4, a PCVD film-forming device 9 comprises a stainless steel chamber 90 having a cylindrical body, a pedestal 91, a gas inlet pipe 92, a gas outlet pipe 93, and a high voltage power supply unit 99. The gas inlet pipe 92 is connected to various kinds of gas cylinders (not shown) by way of valves (not shown). The gas outlet pipe 93 is connected to a rotary pump (not shown) and a diffusion pump (not shown) by way of valves (not shown).

The pedestal 91 for holding substrates 100 and a cylindrical anode plate 94 are provided in the chamber 90. The pedestal 91 is provided in a center portion of the chamber 90. The anode plate 94 is provided coaxially with the chamber 90 along an inner wall of the chamber 90. The pedestal 91 and the anode plate 94 are both formed of stainless steel and respectively connected to the high voltage power supply unit 99.

Example 1

An oriented amorphous carbon film was formed on a surface of a substrate (cold-rolled steel plate: SPCC) by using the above PCVD film-forming device, thereby producing electrically conductive member No. 01.

First, the substrate (50 mm×80 mm×1.5 mm thick) was placed on the pedestal 91. Next, the chamber 90 was sealed and gases in the chamber 90 were evacuated by the rotary pump and the diffusion pump connected to the gas outlet pipe 93. After the gas evacuation to about $1\times10^{-3}$ Pa, 120 sccm of argon gas was introduced from the gas inlet pipe 92 and gas pressure was set at 11 Pa.

When a DC voltage of 200 V was applied between the pedestal 91 (cathode) and the anode plate 94, an electric discharge started. Surface temperature of the substrate was increased to a predetermined temperature by ion bombardment associated with the electric discharge. The surface temperature of the substrate was measured by an infrared radiation thermometer.

Next, in addition to argon gas, 10.7 sccm of pyridine gas and 120 sccm of nitrogen gas were introduced as reaction gas from the gas inlet pipe 92. Gas pressure at this time was 11 Pa. When a DC voltage of 3000 V (electric current: 0.4 A) was applied between the pedestal 91 (cathode) and the anode plate 94, an electric discharge 95 started around the pedestal 91 and the substrate. Surface temperature of the substrate at this time was 400 deg. C.

After a predetermined time passed from the start of the electric discharge, the electric discharge was stopped. Film-forming time was controlled with desired film thickness. Thus obtained was electrically conductive member No. 01 having an amorphous carbon film of about 1 µm in thickness on a surface of the substrate.

Example 2

Electrically conductive member No. 02 was produced by a similar method to that of Example 1, except that DC voltage after introducing the reaction gas was set at 2000 V (electric current: 0.35 A). A substrate during film formation had a surface temperature of 350 deg. C.

Example 3

Electrically conductive member No. 03 was produced by a similar method to that of Example 1, except that tetramethylsilane (TMS) was employed as reaction gas in addition to pyridine gas and nitrogen gas and DC voltage after introducing the reaction gas was set at 3000 V (electric current: 0.35 A). A substrate during film formation had a surface temperature of 400 deg. C.

Example 4

An oriented amorphous carbon film was formed on a surface of a substrate (cold-rolled steel plate: SPCC) by using the above PCVD film-forming device, thereby producing electrically conductive member No. 04.

First, the substrate (50 mm×80 mm×1.5 mm thick) was placed on the pedestal 91. Next, the chamber 90 was sealed and gases in the chamber 90 were evacuated by the rotary pump and the diffusion pump connected to the gas outlet pipe 93. After the gas evacuation to about $1 \times 10^{-3}$ Pa, 120 sccm of argon gas was introduced from the gas inlet pipe 92 and gas pressure was set at 11 Pa.

When a DC voltage of 200 V was applied between the pedestal 91 (cathode) and the anode plate 94, an electric discharge started. Surface temperature of the substrate was increased to a predetermined temperature by ion bombardment associated with the electric discharge. The surface temperature of the substrate was measured by the infrared radiation thermometer.

Next, the introduction of argon gas was stopped and 35 sccm of pyridine gas and 60 sccm of nitrogen gas were introduced as reaction gas from the gas inlet pipe 92. Gas pressure at this time was 11 Pa. When a DC voltage of 3000 V (electric current: 0.4 A) was applied between the pedestal 91 (cathode) and the anode plate 94, an electric discharge 95 started around the pedestal 91 and the substrate. The substrate at that time had a surface temperature of 560 deg. C.

After a predetermined time passed from the start of the electric discharge, the electric discharge was stopped. Film-forming time was controlled with desired film thickness. Thus produced was electrically conductive member No. 04 having an amorphous carbon film of about 1 μm in thickness on a surface of the substrate.

Reference Example 1

Electrically conductive member No. R1 was produced by a similar method to that of Example 1, except that DC voltage after introducing the reaction gas was set at 1000 V (electric current: 0.2 A). A substrate during film formation had a surface temperature of 280 deg. C.

Comparative Example 1

An amorphous carbon film having a thickness of 1 μm was formed on a surface of a substrate by using a commercially available arc ion plating (AIP) device, thereby producing comparative member No. C1. Film-forming conditions were as shown in Table 1.

Comparative Example 2

An amorphous carbon film having a thickness of 3 μm was formed on a surface of a substrate by using a commercially available high frequency sputtering device, thereby producing comparative member No. C2. Film-forming conditions were as shown in Table 1.

Comparative Example 3

An amorphous carbon film having a thickness of 2 μm was formed on a surface of a substrate by using a commercially available high frequency plasma CVD device, thereby producing comparative member No. C3. Film-forming conditions were as shown in Table 1.

TABLE 1

| | SPECIMEN NO. | FILM-FORMING METHOD | POWER SUPPLY | VOLTAGE (V) | REACTION GAS AND CARRIER GAS FLOW RATE (sccm) | | | | | FILM-FORMING TEMP. (° C.) |
| --- | --- | --- | --- | --- | --- | --- | --- | --- | --- | --- |
| | | | | | TMS | METHANE | PYRIDINE | NITROGEN | ARGON | |
| Comp. Ex. 1 | C1 | AIP | DC | 200 | - | Use of Graphite Target | | | - | 400 |
| Comp. Ex. 2 | C2 | High Frequency Sputtering | RF | 300 | - | Use of Graphite Target | | | - | 400 |
| Comp. Ex. 3 | C3 | High Frequency Plasma CVD | RF | 300 | - | 10 | - | - | 30 | 400 |
| Ref. Ex. 1 | R1 | DC PLASMA CVD | High Voltage | 1000 | - | - | 10.7 | 120 | 120 | 280 |
| Ex. 1 | 01 | DC PLASMA CVD | High Voltage | 3000 | - | - | 10.7 | 120 | 120 | 400 |
| Ex. 2 | 02 | DC PLASMA CVD | High Voltage | 2000 | - | - | 10.7 | 120 | 120 | 350 |
| Ex. 3 | 03 | DC PLASMA CVD | High Voltage | 3000 | 0.5 | - | 10.7 | 120 | 120 | 400 |
| Ex. 4 | 04 | DC PLASMA CVD | High Voltage | 3000 | - | - | 35 | 60 | - | 560 |

Evaluation

Electrically conductive member Nos. 01 to 04, R1, and comparative member Nos. C1 to C3 were used as specimens and film composition, film density, electric conductivity, and orientation of the amorphous carbon films were evaluated. Hereinafter, the evaluation methods will be described and the results will be shown.

Film Composition and Film Density

Measurement results of film composition of the amorphous carbon films of the respective specimens are shown in Table 2. The content of C, N and Si in the amorphous carbon films was determined by electron probe micro-analysis (EPMA), X-ray photoelectron spectroscopy (XPS), Auger electron spectroscopy (AES), and Rutherford backscattering spectroscopy (RBS). The H content was measured by elastic recoil detection analysis (ERDA). ERDA is a method of measuring the concentration of hydrogen in a film by radiating a helium ion beam of 2 MeV on a surface of the film and detecting hydrogen expelled from the film by a semiconductor detector. The amount of $Csp^2$ and the amount of $Csp^3$ were determined by the NMR spectrum which has been described in detail before.

Furthermore, density of the amorphous carbon films of the respective members was measured. The density was measured by using X-ray reflectivity method, elastic recoil detection analysis (ERDA), and Rutherford backscattering spectroscopy (RBS). The density was calculated from oscillation amplitude in an X-ray reflectivity spectrum and composition information from ERDA-RBS. The results are shown in Table 2.

TABLE 2

| SPECIMEN NO. | FILM COMPOSITION (at. %) | | | | RATIO IN THE ENTIRE CARBON (%) | | DENSITY (g/cm$^3$) |
|---|---|---|---|---|---|---|---|
| | Si | C | N | H | Csp$^2$ | Csp$^3$ | |
| C1 | 0 | 99 | 0 | 1 | 45 | 55 | 2.5 |
| C2 | 0 | 71 | 0 | 29 | 61 | 39 | 2.06 |
| C3 | 0 | 67 | 0 | 33 | 67 | 31 | 1.74 |
| R1 | 0 | 68 | 10 | 22 | 95 | 5 | 1.66 |
| O1 | 0 | 73 | 13 | 15 | 99 | 1 | 1.95 |
| O2 | 0 | 71 | 12 | 17 | 98 | 2 | 1.81 |
| O3 | 0.9 | 74.1 | 12 | 13 | 95 | 5 | 2.05 |
| O4 | 0 | 82 | 8 | 10 | 96 | 4 | 2.1 |

Electric Conductivity

For evaluation of electric conductivity of the respective members, volume resistivity and contact resistance were measured.

In general, electric resistance of a thin film formed on a surface of a substrate is measured by employing two-terminal method, four-probe method, four-terminal method or the like. Two-terminal method is to measure a voltage drop between two points, but because the voltage drop includes contact resistance between each electrode and the thin film, the two-terminal method cannot precisely measure volume resistivity of the thin film. Therefore, it has been proposed to use four-probe method (JIS K 7194, JIS R 1637) or four-terminal method (ISO 3915), which are free from effect of contact resistance. Therefore, resistance of the amorphous carbon films of the respective electrically conductive members was measured by employing four-probe method. By the way, volume resistivity of a substrate is lower than that of an amorphous carbon film. Therefore, if resistance of the film is measured as it is, an electric current also flows to a substrate side and a measured value of volume resistivity of the amorphous carbon film is lower than an actual value. Therefore, in order to measure volume resistivity of the amorphous carbon film in itself, the following treatment was applied to the respective electrically conductive members (FIG. 5).

Figure 5:
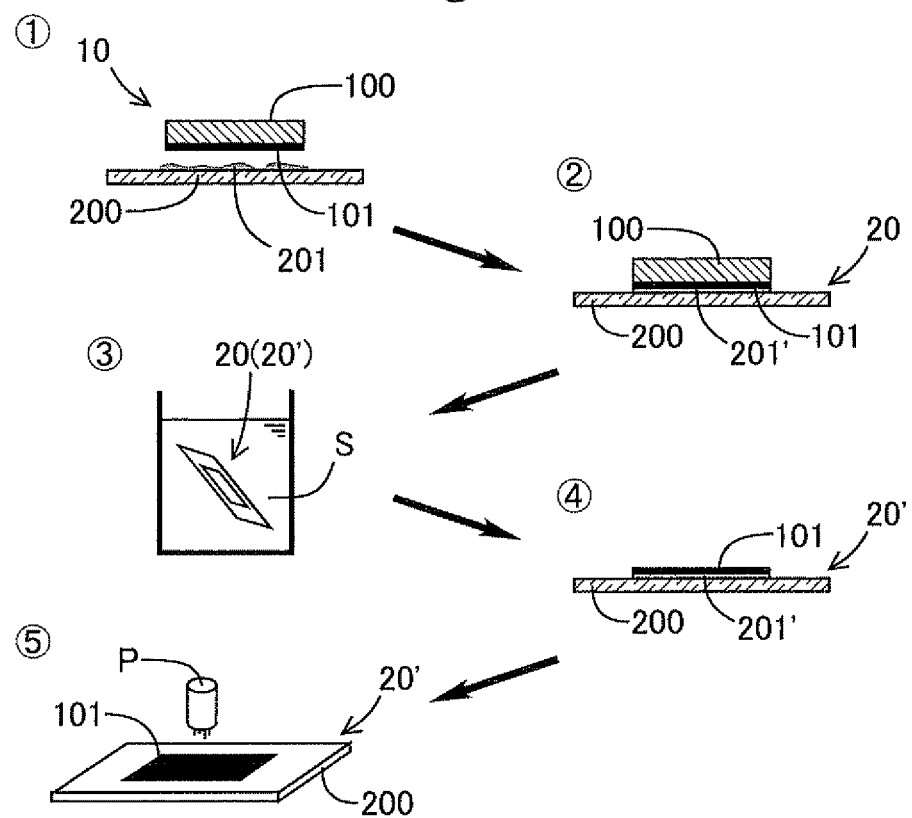
FIG. 5 is a schematic diagram illustrating procedure for preparing a test piece to be used in measuring volume resistivity.

In FIG. 5, a specimen 10 comprises a substrate 100, and an amorphous carbon film 101 formed on a surface of the substrate 100. First, a surface of a glass plate 200 and a surface of the amorphous carbon film 101 of the specimen 10 were bonded together by an adhesive 201 to produce a bonded body 20. After the adhesive 201 was sufficiently dried, the bonded body 20 was immersed in an etching solution S to etch the substrate 100, thereby obtaining a test piece 20' in which the amorphous carbon film 101 was fixed on the surface of the glass plate 200. Here, the glass plate 200 and the adhesive layer 201' formed of the employed adhesive 201 had a volume resistivity of about $10^{14}$ ohm cm, that is to say, were found to be electrically insulated. Accordingly, precise volume resistivity of the amorphous carbon film can be obtained by resistance measurement using the test piece 20'. After the test piece 20' was washed with pure water, a surface of the amorphous carbon film 101 was subjected to XPS analysis and it was confirmed that substrate components such as iron did not remain attached and structural change in carbon did not occur. It was also confirmed under an electron scanning microscope that there were no cracks in the amorphous carbon film 101. Volume resistivity of the amorphous carbon film 101 was measured by four-probe method using the thus obtained test piece 20' and applying an electric current of 100 mA to 0.1 µA. The measurement results are shown in Table 3.

It should be noted that the adhesive 201 employed was α-cyanoacrylate based adhesive, and the etching solution S employed was a ferric chloride solution. Also used was a resistivity meter equipped with a four-pin probe P (Loresta GP produced by Mitsubishi Chemical Co., Ltd.).

Figure 6:
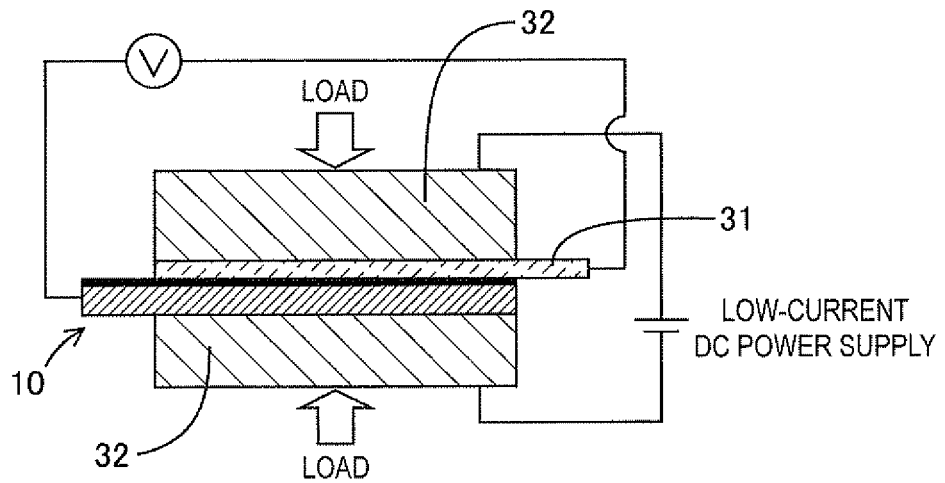
FIG. 6 is a cross sectional view schematically showing construction of a device for measuring contact resistance between an electrically conductive member and carbon paper.

Moreover, contact resistance was measured between each specimen and carbon paper, which constitutes a gas diffusion layer in a fuel cell bipolar plate. As shown in FIG. 6, the contact resistance was measured by placing carbon paper 31 on an amorphous carbon film of a specimen 10 and sandwiching them with two copperplates 32. Each of the copperplates 32 employed had a gold-plated contact surface to contact the specimen 10 or the carbon paper 31. Contact surfaces of the amorphous carbon film of the specimen 10 and the carbon paper 31 had an area of 2 cm×2 cm. A load of 1.47 MPa was applied on the two copperplates 32 in a perpendicular direction to the contact surfaces by a loadcell. Under these conditions, a direct current of 1 A was passed between the two copperplates 32 from a low-current DC power supply. A potential difference between the specimen 10 and the carbon paper 31 was measured after 60 seconds from the start of the load application, and an electric resistance value was calculated from the measured value and regarded as a contact resistance value. The measurement results are shown in Table 3.

It should be noted that since comparative member Nos. C1 to C3 had amorphous carbon films having high resistance, resistivity in Table 3 are values obtained by measuring resistivity of the amorphous carbon film as formed on each substrate by a constant voltage application method (JIS K 6911).

TABLE 3

| SPECIMEN NO. | VOLUME RESISTIVITY (Ωcm) | CONTACT RESISTANCE (mΩcm$^2$) |
|---|---|---|
| C1 | $6.0 \times 10^{10}$ | >100000 |
| C2 | $3.0 \times 10^{10}$ | >100000 |
| C3 | $1.0 \times 10^{10}$ | >100000 |
| R1 | 3.5 | 980 |
| O1 | $2.0 \times 10^{-2}$ | 6 |
| O2 | $1.6 \times 10^{-1}$ | 14 |
| O3 | $3.1 \times 10^{-1}$ | 9 |
| O4 | $9.0 \times 10^{-3}$ | 4 |

Orientation

An orientation index of each of the specimens was obtained by performing X-ray diffraction measurement.

Figure 7A:
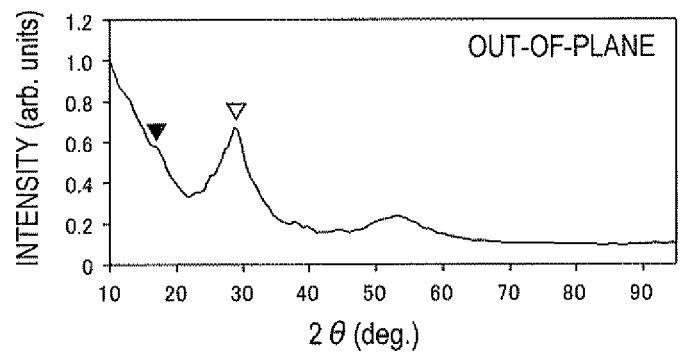
FIG. 7A is a view showing an X-ray diffraction pattern of an oriented amorphous carbon film of the present invention measured by using an out-of-plane diffraction measurement method.
Figure 7B:
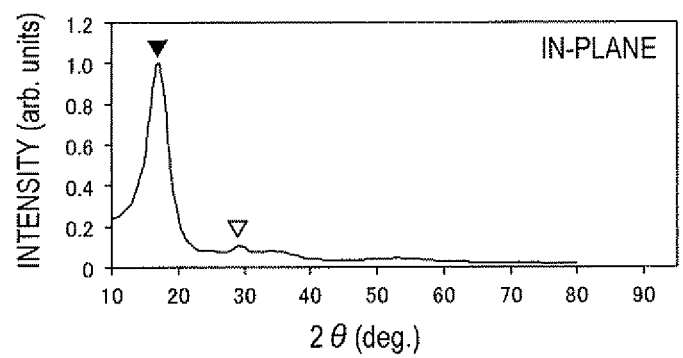
FIG. 7B is a view showing an X-ray diffraction pattern of an oriented amorphous carbon film of the present invention measured by using an in-plane diffraction measurement method.

X-ray diffraction measurement was performed at SPring-8 (BL16XU and BL46XU). Two kinds of diffraction measurements, that is, out-of-plane diffraction measurement and in-plane diffraction measurement were performed on the substrate under the following conditions: incident X-ray energy: 12 keV (wavelength λ: 1.033 Å), incident angle: about 0.1 deg. (under a condition that X-ray is totally reflected by the amorphous carbon film and no X-ray diffracted by the substrate is detected), scan range: 2θ=3 deg. to 2θ=95 deg., (1 deg. per step). FIG. 7A and FIG. 7B show the results of X-ray diffraction measurements of electrically conductive member No. 01. FIG. 7A shows the result of the out-of-plane diffraction measurement, while FIG. 7B shows the result of the in-plane diffraction measurement. Peaks are observed around 2θ=17 deg. and 2θ=29 deg., and when the specimen is assumed to be 2H graphite, these peaks respectively correspond to (002) planes and (100) planes. Therefore, just a mere sight of FIG. 7B is enough to recognize that (002) planes of graphite are preferentially oriented along a thickness direction. However, in order to compare peak intensity of (002) planes and that of (100) planes more quantitatively, the respective peak intensities were calculated as follows.

Peak intensity around 2θ=17 deg. and peak intensity around 2θ=29 deg. were calculated by subtracting background from a spectrum obtained by the X-ray diffraction. Strongest intensity of each peak was regarded as intensity of each peak. Hereinafter, method for subtracting the background will be described.

The background (BG) was introduced by the following formula.

$$BG = a + (bx^2 + cx + d)/(ex^2 + fx + g)$$

In this formula, a to g are arbitrary constant numbers, x is the value of q (unit: $nm^{-1}$, the reciprocal of the value of d, where the value of d is a value which satisfies the diffraction condition 2d sin θ=nλ (Bragg's law)). The constants a to g which simultaneously satisfy the following three conditions were calculated by using the solver function of Microsoft Excel (registered trademark).

I: BG>0
II: (sig.−BG)>0, where sig. is raw data.
III: For the value of q, when x<2 or x>9.5, (sig.−BG) is a minimum An orientation index D was calculated from the peak intensities obtained by the above method. The results are shown in Table 4.

In order to define orientation index more precisely, powder X-ray diffraction simulation of 2H graphite was performed by employing a multipurpose pattern fitting system "RIETAN-FP", which is a Rietveld analysis software (F. Izumi and K. Momma, "Three-Dimensional Visualization in Powder Diffraction" Solid State Phenom., 130, 15-20(2007). In this analysis, a preferred orientation parameter "the value of rl" is defined as a structure parameter. The value of rl is an index of orientation and mentioned in a document (W. A. Dollase, J. Appl. Crystallogr., 19, 267 (1986)). The ratio of peak intensity of (002) planes to that of (100) planes ($I_1/I_2$) was computed while varying the value of rl from 0.5 to 5, and a relation between the value of rl and $I_1/I_2$ was approximated by the least squares method using a power function. It should be noted that the value of rl of about 1 indicates random orientation and, when random orientation is regarded as a standard, a greater value of rl indicates a stronger orientation of a-planes (i.e., (100) planes), and a smaller value of rl indicates a stronger orientation of c-planes planes (i.e., (002) planes).

$$rl = 2.073 \times (T_1/I_2)^{-0.222}$$

In this formula, for in-plane diffraction, rl is an orientation index r in which r=1: random orientation, r<1: c-plane orientation, r>1: a-plane orientation, $I_1$: $I_{002}$, $I_2$:$I_{100}$. For out-of-plane diffraction, rl is an orientation index r' in which r'=1: random orientation, r'<1: c-plane orientation, r'>1: a-plane orientation, $I_1$:$I_{002}'$, $I_2$: $I_{100}'$. The orientation indexes r and r' are shown in Table 4.

TABLE 4

| SPECIMEN NO. | INTENSITY RATIO (IN-PLANE DIFFRACTION) $I_{002}/I_{100}$ | INTENSITY RATIO (OUT-OF-PLANE DIFFRACTION) $I_{002}'/I_{100}'$ | ORIENTATION INDEX D | ORIENTATION INDEX r | ORIENTATION INDEX r' |
|---|---|---|---|---|---|
| C1 | 4.6 | 2.0 | 2.3 | 1.5 | 1.8 |
| C2 | 6.9 | 1.6 | 4.3 | 1.4 | 1.9 |
| C3 | 6.1 | 2.0 | 3.1 | 1.4 | 1.8 |
| R1 | 4.8 | 5.4 | 0.9 | 1.5 | 1.4 |
| 01 | 10.0 | 0.1 | 100 | 1.2 | 3.5 |
| 02 | 6.4 | 0.7 | 9.1 | 1.4 | 2.2 |
| 03 | 7.0 | 0.2 | 35 | 1.3 | 3.0 |
| 04 | 18 | 0.02 | 900 | 1.1 | 4.9 |

Evaluation Results

The orientation index r calculated from the in-plane diffraction intensity ratio was within a range of from 1.1 to 1.5, that is to say, the value of r of all the specimens were close to 1. On the other hand, regarding the orientation index r' calculated from the out-of-plane diffraction intensity ratio, specimen No. R1 having an N-containing amorphous carbon film had an orientation index r' of 1.4, which indicates almost random orientation. Specimen Nos. 01 to 04 had orientation indexes r' of about 2.2 to 5, i.e., not less than 2. r'≥2 indicates that a-planes are preferentially oriented in parallel to the surface and there are few c-planes which are parallel to the surface. That is to say, r'≥2 indicates that c-planes are oriented in a perpendicular direction to the surface of the substrate. Furthermore, Nos. 01 to 04 had high orientation indexes D of 9 or more. Hence, it can be said that each of specimen Nos. 01 to 04 has an oriented amorphous carbon film in which (002) planes are highly oriented in a thickness direction of the film.

Specimen Nos. 01 to 04 exhibited high electric conductivity as indicated by very low volume resistivity in the order of $10^{-1}$ ohm cm or less. Moreover, specimen Nos. 01 to 04 also had very low contact resistance. Specimen Nos. 01 to 04 were electrically conductive members each having an amorphous carbon film containing 8 to 13 at. % of nitrogen, 10 to 17 at. % of hydrogen and having a $Csp^2$ ratio of not less than 95 at. %. Furthermore, the amorphous carbon films of specimen Nos. 01 to 04 were highly oriented as indicated by orientation indexes r' of 2 or more and orientation indexes D of 9 or more. Moreover, the amorphous carbon films of specimen Nos. 01 to 04 had film density of about 2 g/cm³, and were as dense as that of Specimen No. C1 produced by arc ion plating or that of Specimen No. C2 produced by sputtering.

It should be noted that measurement of volume resistivity of each of specimen Nos. 01 to 04 was performed on the surface of the amorphous carbon film by using the abovementioned four-probe method. Since (002) planes of graphite are highly oriented along a thickness direction in specimen Nos. 01 to 04, resistivity measured by passing an electric current in a film thickness direction is assumed to be even lower.

The amorphous carbon films of specimen Nos. 01 to 04 were formed under the following conditions: discharge voltage: not less than 2000 V, and film-forming temperature: not less than 350 deg. C. However, specimen No. R1 having an amorphous carbon film formed at a discharge voltage of 1000 V and a film-forming temperature of 280 deg. C. was inferior to specimen Nos. 01 to 04 in terms of both electric conductivity and orientation. This is believed to be because, since both electric discharge voltage and film-forming temperature were low, in spite of employing pyridine gas and nitrogen gas in combination as reaction gas, a hydrogen atom in pyridine was not smoothly replaced with a nitrogen atom. Therefore, if film-forming temperature is increased in the process for producing specimen No. R1, there is a possibility that the hydrogen content is reduced and a favorable polarized state is obtained, and as a result an amorphous carbon film exhibiting sufficient electric conductivity and orientation is obtained.

Specimen No. 04 formed at an especially high temperature of 560 deg. C. exhibited good electric conductivity, as indicated by low volume resistivity and low contact resistance. The amorphous carbon film of specimen No. 04 had a high orientation index r', which suggests that (002) planes are highly oriented along a thickness direction.

The invention claimed is:

1. An oriented amorphous carbon film containing carbon (C) as a main component, 3 to 20 atomic % of nitrogen (N), and more than 0 atomic % and not more than 20 atomic % of hydrogen (H), and when the total amount of the carbon is taken as 100 atomic %, the amount of carbon having an $sp^2$ hybrid orbital being not less than 70 atomic % and less than 100 atomic %, and
   (002) planes of graphite being oriented along a thickness direction thereof, wherein
   the oriented amorphous carbon film has density of between 1.6 $g/cm^3$ and 3 $g/cm^3$.

2. The oriented amorphous carbon film according to claim 1, further containing more than 0 atomic % and not more than 1 atomic % of silicon (Si).

3. The oriented amorphous carbon film according to claim 1, wherein when powder X-ray diffraction simulation of 2H graphite is performed on a preferred orientation parameter rl from (002) plane orientation through random orientation to (100) plane orientation to obtain a relation between a diffraction pattern and the value of rl,
   $I_{002}$ is intensity of in-plane diffraction from (002) planes of graphite, $I_{100}$ is intensity of in-plane diffraction from (100) planes of graphite, $I_{002}'$ is intensity of out-of-plane diffraction from (002) planes of graphite, and $I_{100}'$ is intensity of out-of-plane diffraction from (100) planes of graphite, all measured by X-ray diffraction method,
   an orientation index r corresponding to "$I_{002}/I_{100}$" calculated from the relation between the diffraction pattern and the value of rl obtained from the powder X-ray diffraction simulation is 0.9 to 1.6, and an orientation index r' corresponding to $I_{002}'/I_{100}'$ calculated from the relation between the diffraction pattern and the value of rl obtained from the powder X-ray diffraction simulation is not less than 2.

4. The oriented amorphous carbon film according to claim 1, wherein, when $I_{002}$ is intensity of in-plane diffraction from (002) planes of graphite, $I_{100}$ is intensity of in-plane diffraction from (100) planes of graphite, $I_{002}'$ is intensity of out-of-plane diffraction from (002) planes of graphite, and $I_{100}'$ is intensity of out-of-plane diffraction from (100) planes of graphite, all measured by X-ray diffraction method, an orientation index obtained by $(I_{002}/I_{100})/(I_{002}'/I_{100}')$ is not less than 9.

5. The oriented amorphous carbon film according to claim 1, having a volume resistivity of not more than $10^{-1}$ ohm cm.

6. The oriented amorphous carbon film according to claim 1, wherein the oriented amorphous carbon film has a density of between 2.0 $g/cm^3$ and 2.4 $g/cm^3$.

7. The oriented amorphous carbon film according to claim 1, wherein the oriented amorphous carbon film is formed by a direct current plasma CVD method.

8. A process for forming the oriented amorphous carbon film according to claim 1 on a surface of a substrate by direct current plasma CVD method, comprising:
   placing the substrate in a reaction vessel, introducing reaction gas comprising at least one kind of compound gas selected from the group consisting of gases of carbocyclic compounds containing carbon having an $sp^2$ hybrid orbital and gases of heterocyclic compounds containing carbon having an $sp^2$ hybrid orbital, and nitrogen and/or silicon, and nitrogen gas into the reaction vessel, and generating an electric discharge by applying a voltage of not less than 1500 V.

9. The process for forming the oriented amorphous carbon film according to claim 8, wherein the reaction gas comprising the gases of N-containing heterocyclic compounds including at least one selected from the group consisting of pyridine, pyridine and pyrrole.

10. An electrically conductive member with an oriented amorphous carbon film, comprising a substrate and the oriented amorphous carbon film according to claim 1 formed on at least part of the substrate.

11. A bipolar plate for a fuel cell, comprising a metal substrate and an amorphous carbon film covering at least on a surface of the substrate to face an electrode,
   wherein the amorphous carbon film is the oriented amorphous carbon film according to claim 1.

* * * * *